United States Patent [19]

Youn

[11] Patent Number: 5,759,884
[45] Date of Patent: Jun. 2, 1998

[54] METHOD FOR FORMING WELL OF SEMICONDUCTOR DEVICE

[75] Inventor: Kang-Sik Youn, Chungcheongbuk-do, Rep. of Korea

[73] Assignee: LG Semicon Co., Ltd., Chungcheongbuk-Do, Rep. of Korea

[21] Appl. No.: 831,864

[22] Filed: Apr. 2, 1997

[30] Foreign Application Priority Data

Oct. 30, 1996 [KR] Rep. of Korea ............... 49962/1996

[51] Int. Cl.$^6$ .................................. H01L 21/8238
[52] U.S. Cl. .................. 438/228; 438/225; 438/227; 438/527; 438/950
[58] Field of Search ................. 438/199, 218, 438/225, 227, 228, 527, 526, 950

[56] References Cited

U.S. PATENT DOCUMENTS

| | | | |
|---|---|---|---|
| 4,516,316 | 5/1985 | Haskell | 438/527 |
| 5,292,671 | 3/1994 | Odanaka | 437/29 |
| 5,362,670 | 11/1994 | Iguchi et al. | 438/228 |
| 5,501,993 | 3/1996 | Borland | 438/526 |
| 5,573,963 | 11/1996 | Sung | 438/228 |
| 5,637,524 | 6/1997 | Lee et al. | 438/228 |

*Primary Examiner*—Trung Dang
*Attorney, Agent, or Firm*—Morgan, Lewis & Bockius LLP

[57] ABSTRACT

A method of forming first and second conductivity type wells in a semiconductor device includes the steps of forming an isolation layer on a semiconductor substrate, forming a multi-layer mask over a portion of the substrate to define the first and second conductivity type wells, implanting a first conductivity type impurity to form the first conductivity type well, removing a partial layer from the multi-layer mask, and implanting a second conductivity type impurity to form the second conductivity type well.

19 Claims, 9 Drawing Sheets

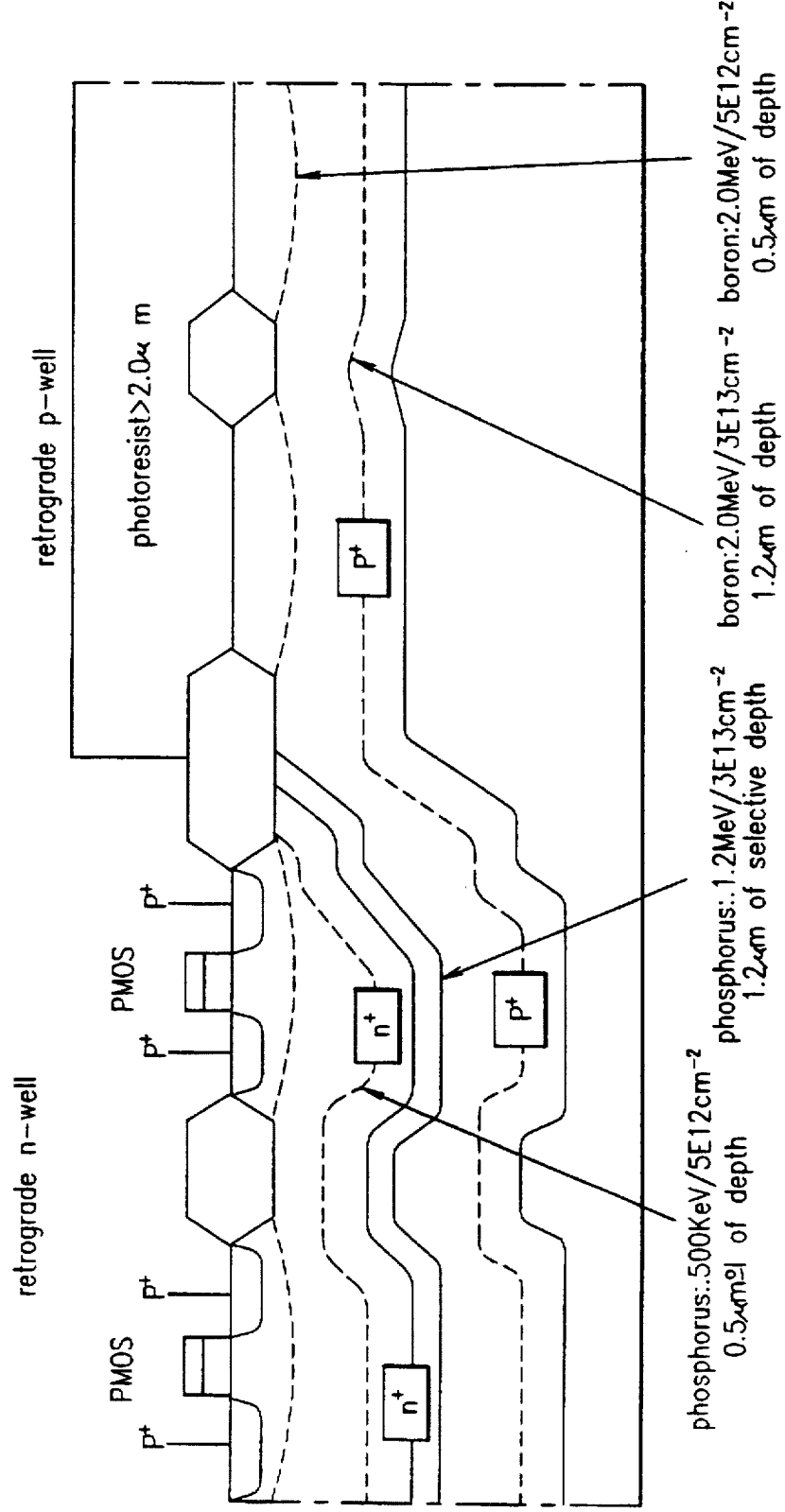

F I G.3
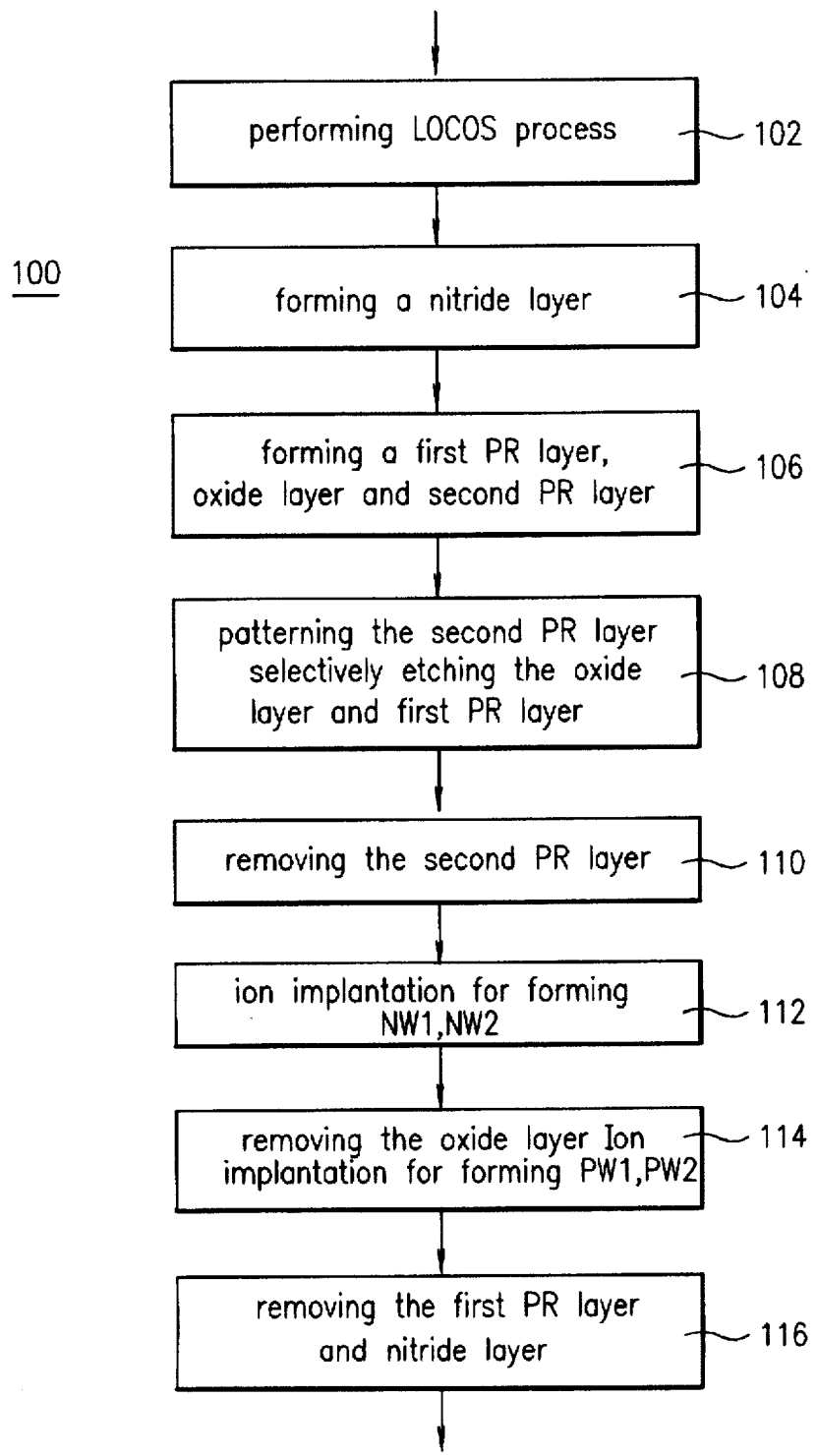

METHOD FOR FORMING WELL OF SEMICONDUCTOR DEVICE

This application claims the benefit of Korean Application No. 49962/1996 filed Oct. 30, 1996, which is hereby incorporated by reference.

BACKGROUND OF THE INVENTION

1. Field of the Invention

The present invention relates to a method of forming a semiconductor device, and more particularly, to a method of forming a well in a semiconductor device. Although the present invention is suitable for a wide scope of applications, it is particularly suitable for forming a well having a buried implanted layer for lateral isolation (BILLI) structure, which controls the profile of the well accurately.

2. Discussion of the Related Art

Generally, for the purpose of improving the characteristic of a semiconductor device, a device is formed on a substrate after an impurity having a conductivity opposite to that of the substrate is implanted into the substrate to form a well. The characteristics of various wells depend on the formation method used. For example, a diffused well is formed by an ion implantation and a diffusion process on the overall surface of the substrate or a part of the substrate before an isolation process, such as a local oxidation of silicon (LOCOS), is performed.

However, in the above-described simple diffused well, it is difficult to control its profile and to carry out the fabrication process. That is, a simple well or twin wells are formed by the diffusion process after the ion implantation is carried out. In this process, the ions are diffused to a predetermined depth. However, the ion profile is not readily controlled because the diffusion occurs not only vertically but also horizontally.

For a retrograde well, the well is formed after the isolation process. That is, wells having conductivities different from each other are formed with a larger ion implantation energy using two masks. A retrograde well having a BILLI structure is formed using a similar method as the aforementioned retrograde well fabrication method. The BILLI-structure well is formed using one mask.

As shown in FIG. 1, after an isolation process is carried out, ions are implanted using one mask to form an n-well and p-well. Here, the ion implantation processes for forming the n-well and p-well are performed using different energies with respect to their conductivities. In other words, in order to form the n-type retrograde well, after the p-well region is covered with a thick photoresist layer, ion implantation is carried out with an energy that is not high enough for the ions to penetrate the photoresist layer. Conversely, to form the p-well, ion implantation is performed with a higher energy such that the ions can penetrate the photoresist layer. Accordingly, the BILLI-structure well can reduce the number of mask forming steps and result in simplifying its process.

A conventional method of forming a well of a semiconductor device will be explained below with reference to the accompanying drawings. FIGS. 2A to 2E are cross-sectional views showing the conventional method of forming a well of a semiconductor device.

Referring to FIG. 2A, after an oxide is thermally grown on a p-type silicon substrate 10, an LOCOS process is carried out to form a field oxide layer 11. A nitride layer 12 is formed on the overall surface over the substrate including the field oxide layer 11.

Referring to FIG. 2B, a thick photoresist layer 13 is formed on a portion of nitride layer 12 corresponding to a region in which a p-well will be formed. The thickness of photoresist layer 13 is above 2 µm. Referring to 2C, an n-type impurity such as phosphorus (P) is implanted into the p-type silicon substrate 10 on which photoresist layer 13 is formed, to thereby form a first n-type impurity region 14.

Then, an n-type impurity, for example, phosphorus, is implanted into the substrate again to form a second n-type impurity region 15. Here, the ion implantation processes for forming the first and second n-type impurity layers are carried out using an energy that does not allow the ions to penetrate the photoresist layer 13. Since the photoresist layer 13 is thick, ions are prevented from penetrating into the p-type silicon substrate 10 on which photoresist layer 13 is formed.

Referring to FIG. 2D, p-type impurity ions such as boron (B) are implanted into the p-type silicon substrate 10 using an energy high enough so that the ions can penetrate the photoresist layer 13. A first p-type impurity region 16 is formed in this process. Then, p-type impurity ions (B) are implanted again to form a second p-type impurity region 17 on the first p-type impurity region 16. Referring to FIG. 2E, the nitride layer 12 and the photoresist layer 13 are removed to form a retrograde well having a BILLI structure.

In the above-described conventional method of forming a well of a semiconductor device, the number of mask forming steps is reduced. However, because the thick photoresist layer is used, it is difficult to control accurately the profile range of the ion implantation. Furthermore, the standard deviation of the impurity region is so large that its isolation characteristic is not desirable.

SUMMARY OF THE INVENTION

Accordingly, the present invention is directed to a method of forming a well of a semiconductor device that substantially obviates one or more of the problems due to limitations and disadvantages of the related art.

An object of the present invention is to provide a method of forming a well that accurately controls the ion implantation profile of the well using a multi-layer photoresist.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of forming a well of a semiconductor device includes the steps of forming an isolation layer on a semiconductor substrate, forming a multi-layer mask over a portion of the substrate to define the first and second conductivity type well, implanting a first conductivity type impurity to form the first conductivity type well, removing a partial layer from the multi-layer mask, and implanting a second conductivity type impurity to form the second conductivity type well.

In another aspect of the present invention, a method of forming a well of a semiconductor device includes the steps of defining an isolation region in a semiconductor substrate of a first conductivity type, forming a field oxide layer on the semiconductor substrate at the isolation region, forming a nitride layer on an overall surface over the substrate including the field oxide layer, forming a first photoresist layer, oxide layer and second photoresist layer on the nitride layer, patterning the second photoresist layer, patterning the oxide layer using the second photoresist layer patterned as a mask, removing the second photoresist layer and a portion of the first photoresist layer, implanting a second conductivity type impurity using the first photoresist layer and oxide layer as masks to form the first conductivity type wells having an opposite conductivity with respect to the substrate, removing the oxide layer, implanting a first conductivity type impurity to form the second conductivity type well having the same conductivity as the substrate, and removing the first photoresist layer and the nitride layer.

In another aspect of the present invention, a method of forming a well of a semiconductor device includes the steps of forming a first oxide layer on a p-type semiconductor substrate, forming a field oxide layer from the first oxide layer at a predetermined isolation region using an LOCOS process, forming a nitride layer on an overall surface over the substrate including the field oxide layer, forming a first photoresist layer, second oxide layer and second photoresist layer on the nitride layer using an SPG process, patterning the second photoresist layer, patterning the oxide layer using the second photoresist layer as a mask, removing the second photoresist layer and a portion of the first photoresist layer, injecting an n-type impurity using the first photoresist layer and the oxide layer as masks to form the n-type wells, removing the second oxide layer, injecting a p-type impurity to form the p-type wells, and removing the first photoresist layer and the nitride layer.

In a further aspect of the present invention, a method of forming a well of a semiconductor device includes the steps of forming an isolation layer on a semiconductor substrate, defining first and second well regions on the semiconductor substrate, and forming a mask layer on the second well region of the substrate, the mask layer being formed of at least two layers laminated, ion-implanting a first conductivity of impurity, to thereby form a first conductivity of well in the first well region, and removing a part of layer of the mask layer, and ion-implanting a second conductivity of impurity, to thereby form a second conductivity of well in the second well region.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIG. 1 is a cross-sectional view of a conventional retrograde well having a BILLI structure;

FIG. 3 is a flowchart for forming a well of a semiconductor device according to the present invention.

DETAILED DESCRIPTION OF PREFERRED EMBODIMENT

Figure 2A:
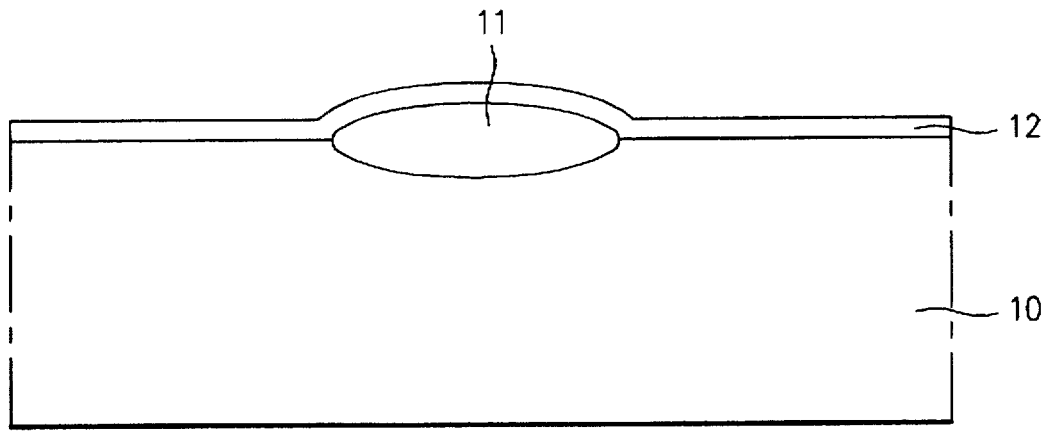
FIGS. 2A to 2E are cross-sectional views showing a method of forming a conventional semiconductor device.
Figure 2B:
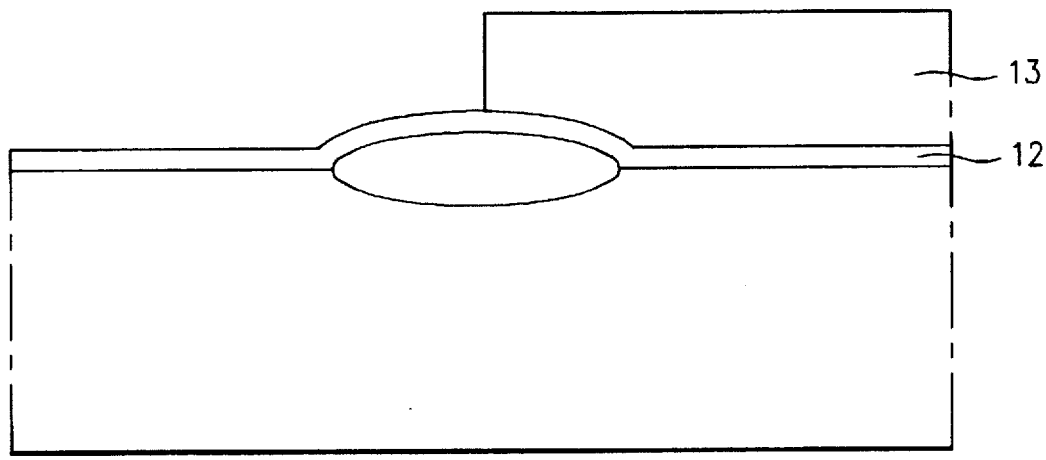
Figure 2C:
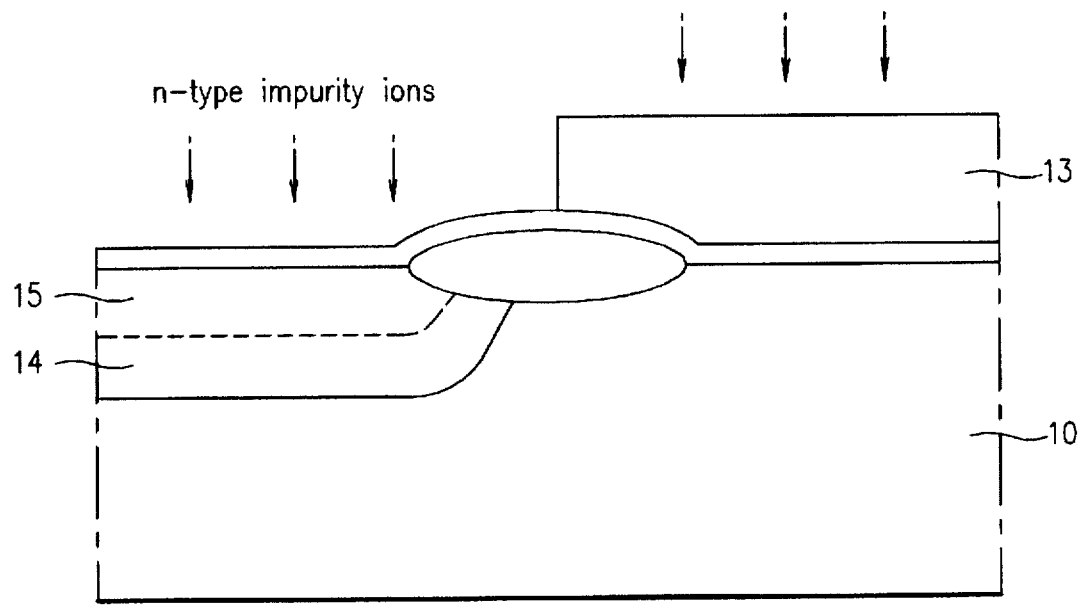
Figure 2D:
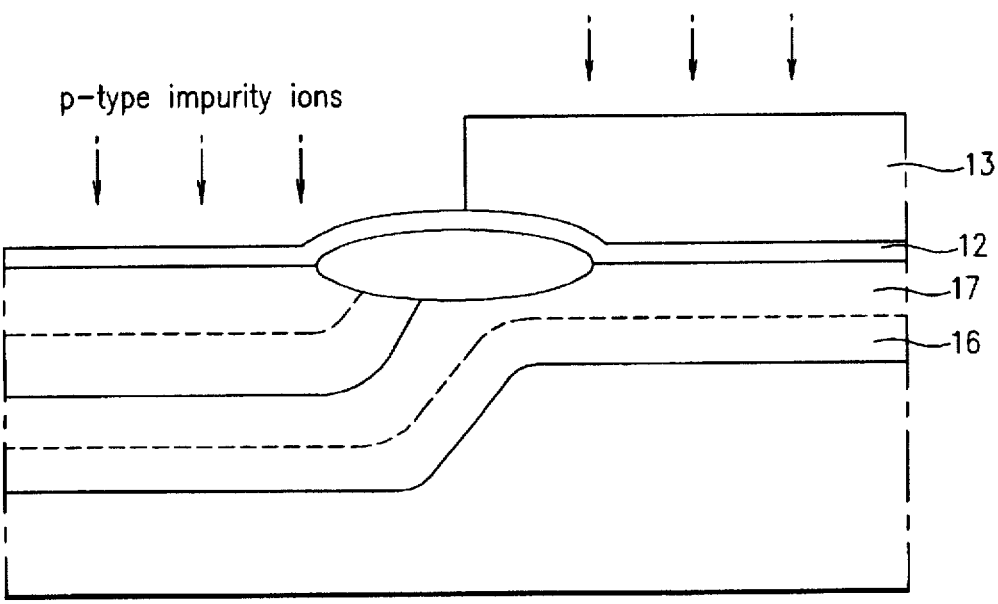
Figure 2E:
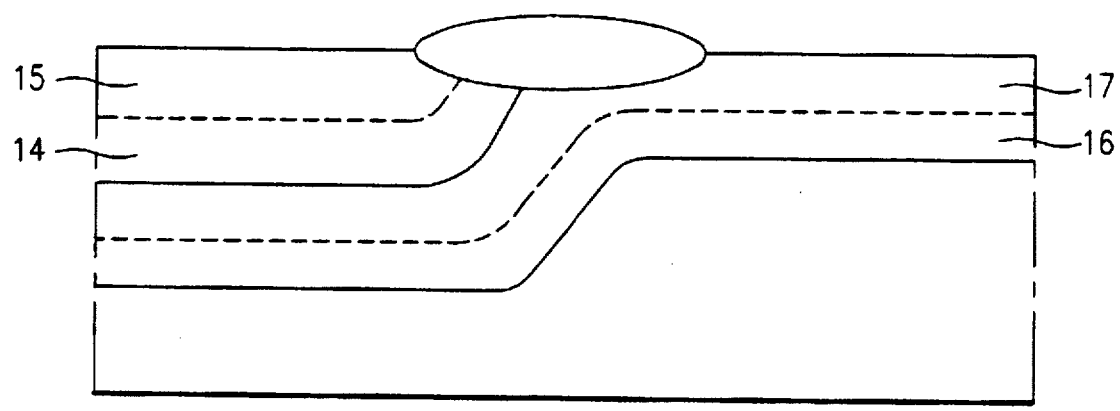

Reference will now be made in detail to the preferred embodiments of the present invention, examples of which are illustrated in the accompanying drawings.

Referring to FIG. 3, a flowchart 100 shows steps for forming a retrograde well having a BILLI structure using a multi-layer photoresist as a mask. The steps include performing an LOCOS process, forming a nitride layer 104, forming a first photoresist layer, oxide layer and second photoresist layer 106, patterning the second photoresist layer, selectively etching the oxide layer and first photoresist layer 108, removing the second photoresist layer 110, implanting to form a first and second n-type well 112, removing the oxide layer and implanting to form a first and second p-type well 114, and removing the first photoresist layer and nitride layer 116.

Figure 4A:
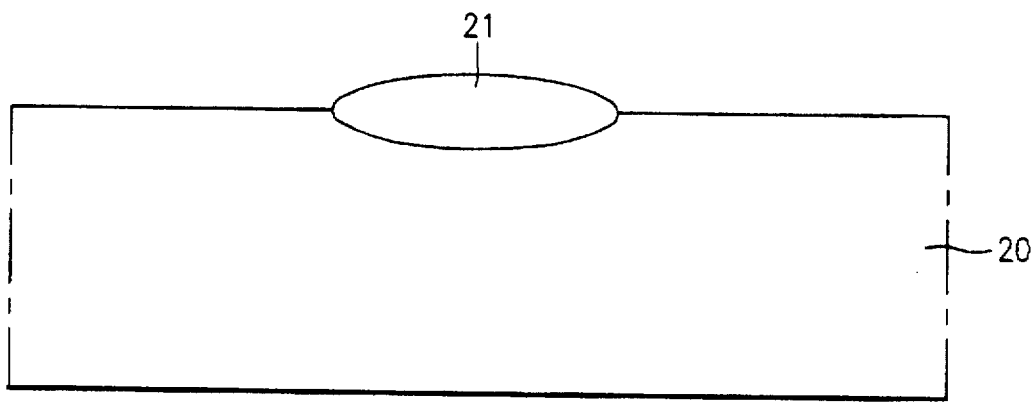
FIGS. 4A to 4H are cross-sectional views showing a method of forming a well of a semiconductor device according to the present invention.
Figure 4B:
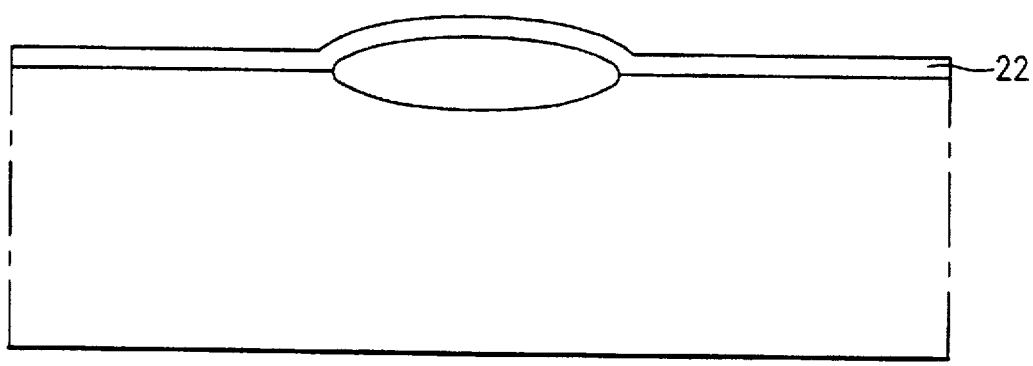

A method for forming a well using the multi-layer photoresist will be explained below with reference to FIGS. 4A to 4H. Referring to FIG. 4A, an oxide layer is thermally grown on a p-type silicon substrate 20, and an LOCOS process is carried out to form a field oxide layer 21. As shown in FIG. 4B, a nitride layer 22 is formed on the p-type silicon substrate 20 on which the field oxide layer 21 is formed.

Figure 4C:
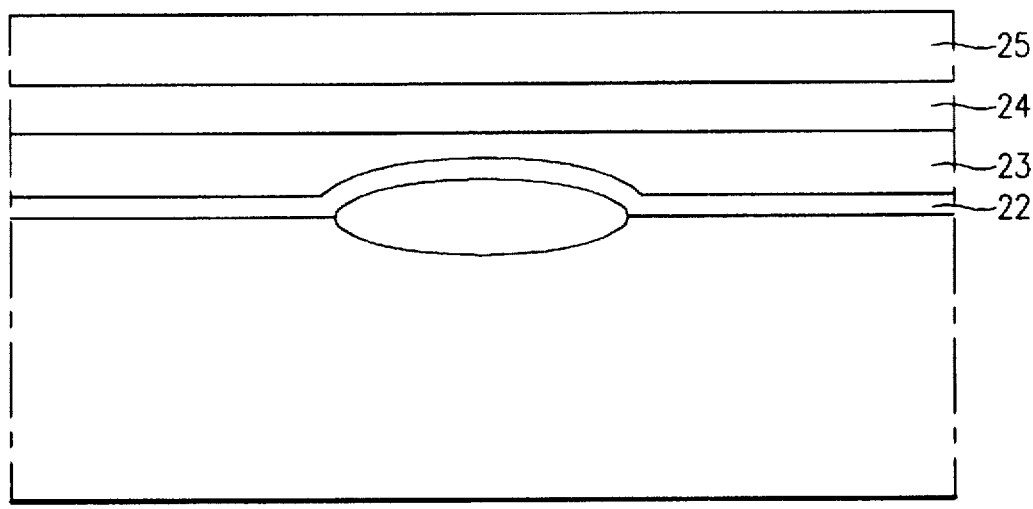

Referring to FIG. 4C, a first photoresist layer 23, oxide layer 24, and second photoresist layer 25 are sequentially formed on the overall surface over the nitride layer 22 to form a multi-layer photoresist.

Figure 4D:
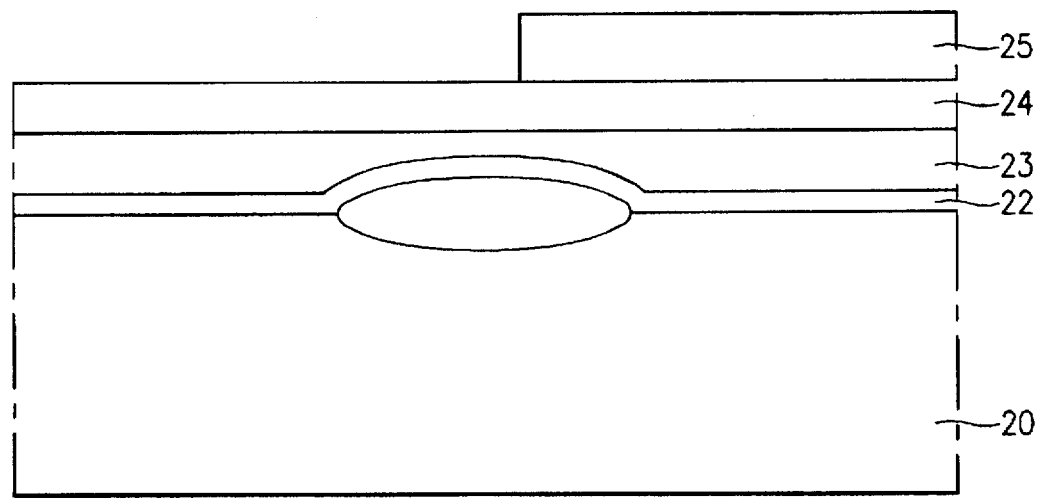
Figure 4E:
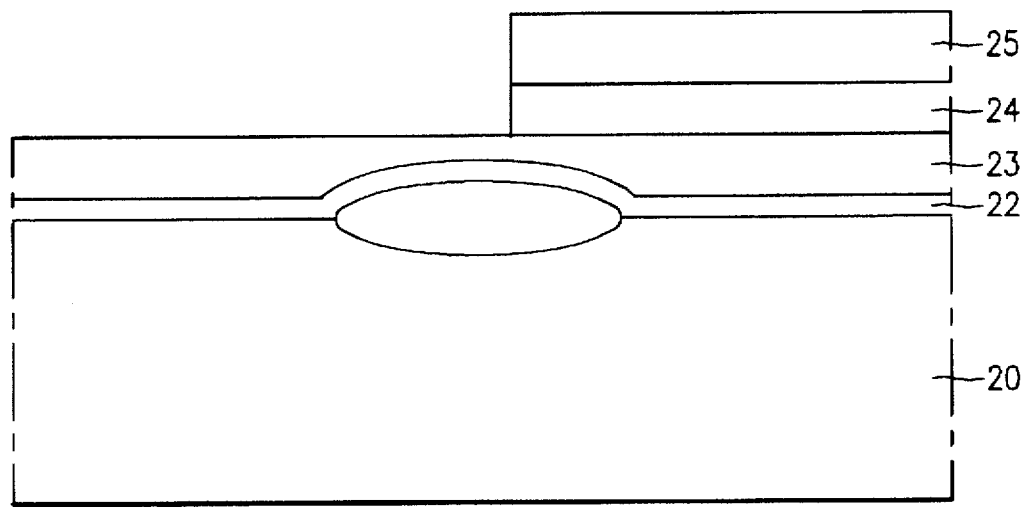
Figure 4F:
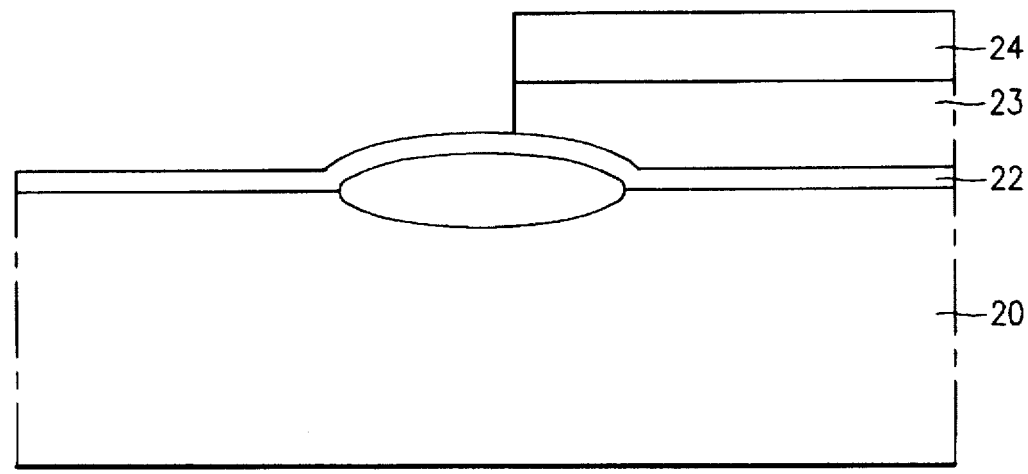

Referring to FIG. 4D, the second photoresist layer 25 is patterned through an exposure and development process using a predetermined well pattern mask (not shown) to form a photoresist pattern 25. As shown in FIG. 4E, the oxide layer 24 is etched using the photoresist pattern 25 as a mask. Thereafter, as shown in FIG. 4F, the first photoresist layer 23 is selectively etched using the oxide layer 24 as a mask. Here, the photoresist pattern 25 is removed when the first photoresist layer 23 is etched. As a result, the first photoresist layer 23 and the oxide layer 24 remain only on the portion of nitride layer 22 corresponding to a predetermined p-well region.

Figure 4G:
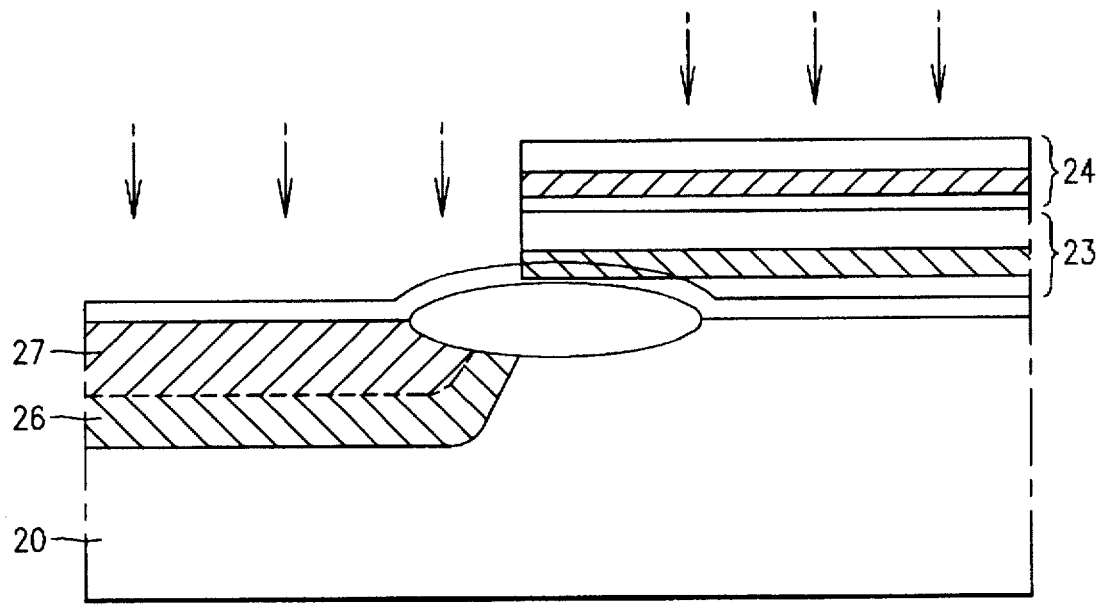

Referring to FIG. 4G, an n-type impurity such as phosphorus is implanted into the p-type silicon substrate 20 using the first photoresist layer 23 and the oxide layer 24 as a mask to form a first n-type impurity region 26 at a predetermined portion of the p-type silicon substrate 20. Then, an n-type impurity (phosphorus) is implanted again to form a second n-type impurity region 27 above the first n-type impurity region 26. Here, the second n-type impurity region 27 is formed using an ion implantation energy lower than that of the first n-type impurity region 26. In this process, n-type impurity layers are also formed in the first photoresist layer 23 and oxide layer 24.

Figure 4H:
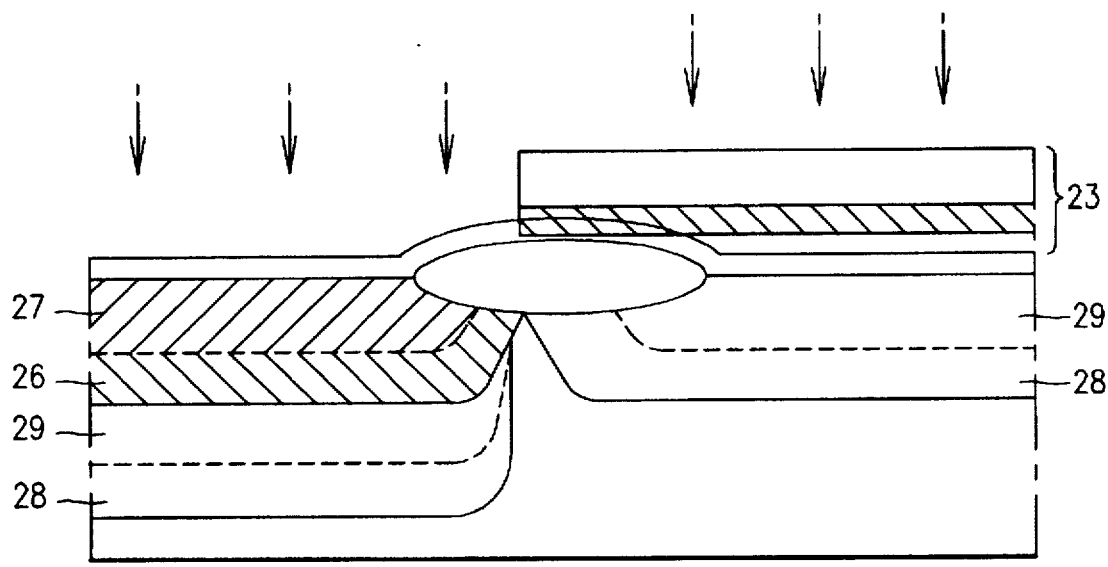

Referring to FIG. 4H, the oxide layer 24 is removed, and then p-type impurity ions such as boron are implanted into the substrate to form a first p-type impurity region 28. Then, p-type impurity ions such as boron are implanted into the substrate again to form a second p-type impurity region 29 above the first p-type impurity region 28. Here, the first p-type impurity region 28 is formed using an ion implantation energy higher than that of the first n-type impurity region 26. The second p-type impurity region 29 is formed using an ion implantation energy higher than that of the first n-type impurity region 26 but lower than that of the first p-type impurity region 28.

Furthermore, the first and second p-type impurity regions 28 and 29 are formed symmetrically to the first and second n-type impurity regions 26 and 27, respectively. That is, the first and second n-type impurity regions 26 and 27 at the n-well region have the same thickness, respectively as the first and second p-type impurity regions 28 and 29 at the p-well region.

Thus, by controlling the ion implantation energy as described above, the p-type impurity ions penetrate the first photoresist layer 23 and are implanted into the p-type silicon substrate 20. Moreover, the first and second p-type impurity regions 28 and 29 are also formed below the first n-type impurity region 26. The nitride layer 22 prevents the p-type silicon substrate 20 from being overetched during the etching process of the oxide layer 24, and the first photoresist layer 23 as shown in FIGS. 4E and 4F. The oxide layer etching process is performed for the purpose of defining an accurate well profile and reducing the standard deviation when the ion implantation is performed for forming the p-well. Thus, a desirable isolation characteristic can be achieved by the process.

According to the method for forming a well in the present invention, since the photoresist layer can be readily controlled using the multi-layer photoresist, the profile of the well can be accurately controlled without increasing the number of mask forming steps. Furthermore, the standard deviation of the impurity region at the well is reduced. Thus, the method of the present invention improves the isolation characteristic and reliability of the device.

It will be apparent to those skilled in the art that various modifications and variations can be made in the method for forming a well of a semiconductor device of the present invention without departing from the spirit or scope of the invention. Thus, it is intended that the present invention cover the modifications and variations of this invention provided they come within the scope of the appended claims and their equivalents.

What is claimed is:

1. A method of forming first and second conductivity type wells in a semiconductor device, the method comprising the steps of:

forming an isolation layer on a semiconductor substrate;

forming a multi-layer mask over a portion of the substrate to define the first and second conductivity type wells;

implanting a first conductivity type impurity into the substrate to form the first conductivity type well;

removing a partial layer from the multi-layer mask; and implanting a second conductivity type impurity into the substrate to form the second conductivity type well.

2. The method according to claim 1, wherein the isolation layer is formed with a field oxide layer.

3. The method according to claim 1, wherein the step of forming the isolation layer uses an LOCOS process.

4. The method according to claim 1, wherein the step of forming the multi-layer mask includes the steps of forming a photoresist layer and an oxide layer on the photoresist layer.

5. The method according to claim 1, wherein the step of forming the multi-layer mask over the portion of the substrate includes the steps of:

forming a first photoresist layer;

forming an oxide layer on the first photoresist layer;

forming a second photoresist layer on the oxide layer;

patterning the second photoresist layer corresponding to the first conductivity type well;

removing a portion of the oxide layer using the second photoresist layer as a mask; and removing a portion of the first photoresist layer using the oxide layer as a mask.

6. The method according to claim 1, wherein the second conductivity type impurity is injected into the substrate with an energy higher than that of the first conductivity type impurity.

7. The method according to claim 1, wherein the first conductivity type well has a same thickness as the second conductivity type well.

8. The method according to claim 1, further comprising the step of forming an insulating layer on an overall surface of the semiconductor substrate and the isolation layer before the step of forming the multi-layer mask.

9. The method according to claim 1, wherein the step of forming the multi-layer mask includes the step of controlling a thickness of the mask and the step of implanting the second conductivity type impurity includes the step of controlling an ion implantation energy to control thickness of the first conductivity type well and the second conductivity type well.

10. A method of forming wells in a semiconductor device, the method comprising the steps of:

defining an isolation region in a semiconductor substrate of a first conductivity type;

forming a field oxide layer on the semiconductor substrate at the isolation region;

forming a nitride layer on an overall surface over the substrate including the field oxide layer;

forming a first photoresist layer, an oxide layer, and a second photoresist layer on the nitride layer, respectively;

patterning the second photoresist layer;

patterning the oxide layer using the second photoresist layer patterned as a mask;

removing the second photoresist layer and a portion of the first photoresist layer corresponding to the oxide layer patterned as a mask;

implanting a second conductivity type impurity using the first photoresist layer and the oxide layer as masks to form a first conductivity type well having an opposite conductivity with respect to the substrate;

removing the oxide layer;

implanting a first conductivity type impurity to form a second conductivity type well having a same conductivity as the substrate; and removing the first photoresist layer and the nitride layer.

11. The method according to claim 10, wherein the first conductivity type impurity is injected into the substrate with an energy higher than that of the second conductivity type impurity.

12. The method according to claim 10, wherein the first and second wells in the second conductivity type impurity implanting step are formed to have a same respective thicknesses as the first and second wells of the first conductivity type impurity implanting step.

13. The method according to claim 10, wherein the step of forming the field oxide layer includes an LOCOS process.

14. A method of forming an n-type and p-type wells in a semiconductor device, the method comprising the steps of:

forming a first oxide layer on a p-type semiconductor substrate;

forming a field oxide layer from the first oxide layer at a predetermined isolation region using an LOCOS process;

forming a nitride layer on an overall surface over the substrate including the field oxide layer;

forming a first photoresist layer, a second oxide layer, and a second photoresist layer on the nitride layer;

patterning the second photoresist layer;

patterning the oxide layer using the second photoresist layer as a mask;

removing the second photoresist layer and a portion of the first photoresist layer;

injecting an n-type impurity using the first photoresist layer and the oxide layer as masks to form the n-type wells;

removing the second oxide layer;

injecting a p-type impurity to form the p-type wells; and removing the first photoresist layer and the nitride layer.

15. The method according to claim 14, wherein the step of forming the n-type wells includes the step of forming a first n-type impurity region and a second n-type impurity region.

16. The method according to claim 15, wherein the second n-type impurity region is formed using an ion implantation energy lower than the first n-type impurity region.

17. The method according to claim 14, wherein the step of forming the p-type wells includes the step of forming a first p-type impurity region and a second p-type impurity region.

18. The method according to claim 17, wherein the second p-type impurity region is formed using an ion implantation energy lower than the first p-type impurity region.

19. The method according to claim 14, wherein the step of injecting the p-type impurity is performed with a higher implantation energy than the step of injecting the n-type impurity.

* * * * *